United States Patent [19]

Richards et al.

[11] Patent Number: 4,802,110

[45] Date of Patent: Jan. 31, 1989

[54] TWO-DIMENSIONAL FINITE IMPULSE RESPONSE FILTER ARRANGEMENTS

[75] Inventors: John W. Richards, Chilbolton; Morgan W. A. David, Farnham, both of England

[73] Assignee: Sony Corporation, Tokyo, Japan

[21] Appl. No.: 937,326

[22] Filed: Dec. 3, 1986

[30] Foreign Application Priority Data

Dec. 17, 1985 [GB] United Kingdom ............... 8531081

[51] Int. Cl.[4] .............................................. G06F 7/38
[52] U.S. Cl. ................................... 364/724.05; 382/56
[58] Field of Search .................... 364/724; 382/54, 56

[56] References Cited

U.S. PATENT DOCUMENTS 4,610,026  9/1986  Tabata et al. ...................... 382/47
4,682,301  7/1987  Horiba et al. ...................... 364/724

FOREIGN PATENT DOCUMENTS 2172167  9/1986  United Kingdom .

Primary Examiner—Gary V. Harkcom
Assistant Examiner—Tan V. Mai
Attorney, Agent, or Firm—Lewis H. Eslinger; Jay H. Maioli

[57] ABSTRACT

A two-dimensional finite impulse response (2D-FIR) filter arrangement includes a 2D-FIR filter (26,30,32,34) operative during each of successive clock periods equal to T (where T is the spacing of digital samples or words of an image signal) to effect filtration over a predetermined area of the image by processing n×m words of the signal, having a predetermined spatial relationship in the form of an array, to produce an intermediate word. Some of the intermediate words are stored in a partial products store (28). A controller (60) is responsive to a signal (HCF,VCF) indicating an extent to which the image is to be compressed to do two things. First, it causes the FIR filter (26,30,32,34) to adopt a bandwidth which is reduced, with respect to a value for zero compression, by an extent related to the extent of compression. This reduces or prevents aliasing that otherwise would be caused by the compression operation. Second, it causes a plurality of the intermediate words, the size of which plurality is related to the extent of compression, to be combined (48) to produce output words (56) representation of filtration over an area of the image which is a multiple of the predetermined area, thereby improving the response of the filter arrangement.

20 Claims, 9 Drawing Sheets

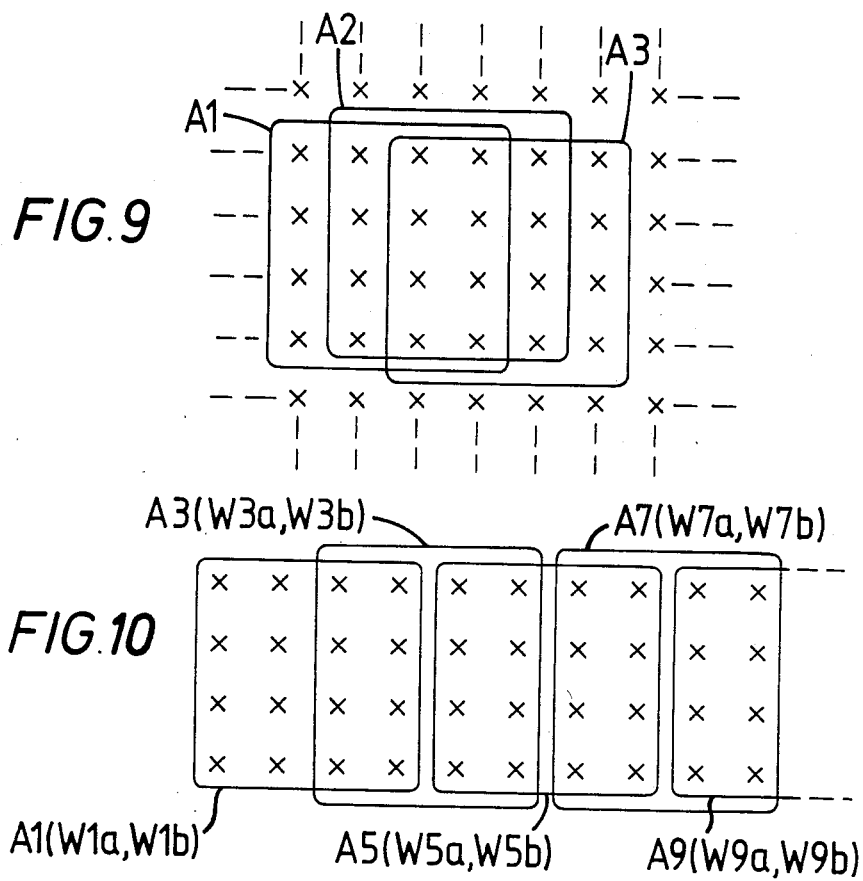
FIG.9
FIG.10
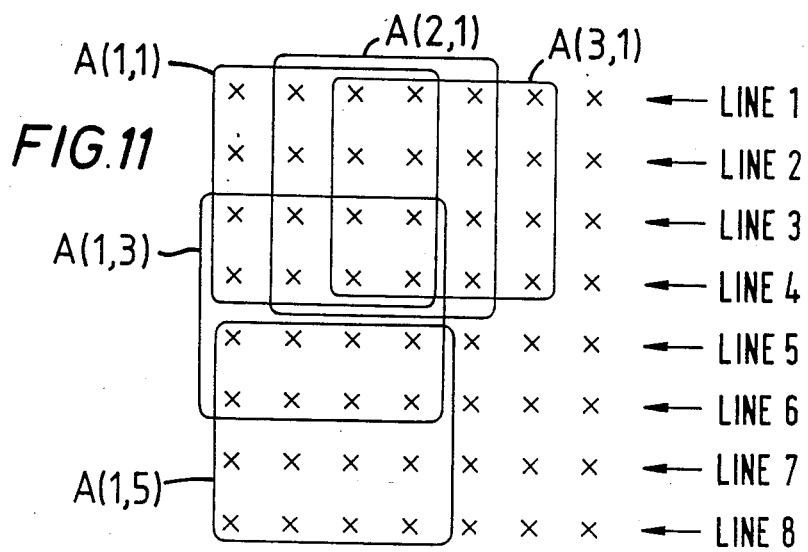
FIG.11

TWO-DIMENSIONAL FINITE IMPULSE RESPONSE FILTER ARRANGEMENTS

BACKGROUND OF THE INVENTION

1. Field of the Invention

This invention relates to two-dimensional finite impulse response filter arrangements for filtering a signal that represents an image and comprises a sequence of digital words.

2. Description of the Prior Art

It is known to digitize a signal obtained by scanning a two-dimensional image or picture, for example a television signal, by sampling the signal at a sampling frequency fs, that is at predetermined intervals or clock periods T (where T=1/fs), to provide a digital image signal that comprises a sequence of digital words or samples (for example 8-bit words or samples) spaced in time by the interval T. Such an image signal can conveniently be manipulated. It can, for example, be reduced in size (compressed) in either or both dimensions, namely horizontally (that is in the direction in which the image is scanned in a line-sequential manner) or vertically (transverse to the image scanning direction), for instance in the creation of digital video effects. As will now be described, in the absence of a suitable corrective measure compression of the image can give rise to aliasing.

As is known to those skilled in the art, an image can be characterized by a two-dimensional parameter known as spatial frequency, which is proportional to the reciprocal of the angle subtended to the eye of the viewer by the visual spectral components of the image. The concept of spatial frequency can more readily be appreciated by considering an image in the form of a series of uniformly spaced straight lines. For a fixed position of the viewer with respect to such an image, the image has a single spatial frequency which is inversely proportional to the apparent spacing of the lines. (The spatial frequency is horizontal if the lines are spaced horizontally, vertical if the lines are spaced vertically, and diagonal in other cases). Clearly, if the image is compressed, so that the lines appear to the viewer to become closer together whereby the angle they subtend to the eye of the viewer decreases, the spatial frequency increases.

The scaling theorem in Fourier analysis states that if an image signal is compressed in the spatial domain, that is if the spatial frequency of the image is increased, then the Fourier transform of the signal increases in the frequency domain (that is, the frequency (in Hz) of the signal increases); and vice versa.

It will be recalled that the image signal discussed above is a sampled signal. Nyquist's Rule concerning the sampling of signals states that, in order not to lose information contained in a signal, the signal must be sampled at a frequency (fs) that is equal to at least twice the bandwidth (fB) of the signal. Naturally, this criterion is complied with when the digital input signal is formed initially by sampling an analog signal. The frequency spectrum (Fourier transform) of the sampled signal in the frequency domain is shown by the solid lines in FIG. 1 of the accompanying drawings, which is a graph of amplitude v. frequency (Hz). The frequency spectrum comprises a baseband component 10 (up to fB). Also, the baseband is reflected symmetrically around the sampling frequency fs and its harmonics 2fs, 3fs etc. to produce higher frequency components 12. Provided that Nyquist's Rule is complied with (so that fs/2 is greater than fB) and provided that the signal is band-limited (low-pass filtered) so as to have a cut-off frequency of about fs/2, the higher frequency components 12 will be suppressed.

As explained above, when the sampled signal is subjected to compression in the spatial domain, its Fourier transform exhibits expansion in the frequency domain. Thus, the bandwidths of the components 10, 12 in FIG. 1 increase. As shown by dotted lines in FIG. 1, this can result in aliasing of the signal in that the bandwidth fB of the signal can exceed the Nyquist limit (fs/2) so that part of at least the lowest one of the higher frequency components 12 extends down into and is mixed with the baseband 10 so as to degrade the signal and therefore the image that it represents.

To prevent aliasing due to compression, a filter can be positioned in advance of the compression means to filter out those parts of the two-dimensional input spectrum that otherwise would exceed the Nyquist limit frequency (fs/2) once compression has been carried out. Ideally, the filter should have a flat pass band, infinite attenuation in the stop band and a transition band whose width approaches zero. Naturally, such an ideal filter cannot be realised in practice. However, by using a two-dimensional (2D) finite impulse response (FIR) filter, an adequate filter characteristic can be obtained.

As is known to those skilled in the art, a 2D-FIR filter is operative during successive clock periods equal to T(=1/fs) to effect filtration over a predetermined area of the 2D image or picture by processing a set of words or samples of the image signal having a predetermined spatial relationship to produce therefrom a filtered output word or sample. Specifically, during each clock period, the 2D-FIR filter is operative to calculate an output word or sample by multiplying a predetermined set of vertically and horizontally spaced words or samples of its input signal by respective weighting coefficients and summing the products of the multiplication operations. The necessary temporal delays to achieve the desired spatial relationship of the predetermined set of input words or samples can be achieved by delay elements positioned either in advance of or after respective multipliers used to carry out the multiplication operations. The delay elements thus can be considered to "tap" the image signal, in both directions. As is known to those skilled in the art, the response of the filter approaches more closely that of an ideal filter as the number of taps is increased.

Consider a compression means (for example a digital video effects unit) that is required to carry out compression over a range from zero compression (1:1) to, say, 100:1, the extent of compression being selectable in, for example, an infinitely variable manner. Consider also that the compression means is preceded by a 2D-FIR filter whose bandwidth is adjusted in accordance with the extent or degree of compression so as to avoid or at least minimize aliasing which otherwise would occur, in the event of compression, in the manner described above. In practice, it would not be feasible to design the filter so that its bandwidth is infinitely variable so that it can follow precisely the infinitely variable extent of compression. However, it would be feasible to design a 2D-FIR filter that would have a family of bandwidths (i.e. that would be capable of producing a family of responses) each corresponding to a respective range of compression. (In this connection, as is known in the art, the bandwidth of an FIR filter of a given configuration is determined by the values chosen for the weighting coefficients, whereby a family of responses can be obtained by previously calculating and storing a corresponding family of weighting coefficient sets). Thus, the filter might for example be designed to produce a family of bandwidths ranging from fs/2 (for zero compression) to fs/200 (for 100:1 compression). FIGS. 2A, 2B, 2C and 2D of the accompanying drawings show (in idealised form) responses that might be obtained for respective extents of compression of 1:1, 2:1, 3:1 and 100:1.

It should be appreciated that the image may be compressed in either or both of the horizontal and vertical directions, possibly by different respective degrees; and that a 2D-FIR filter has both horizontal and vertical bandwidths which may be varied independently of one another by suitably choosing the values of the weighting coefficients. Thus, it should be appreciated that the comments made above (and below) relating to bandwidth and compression apply independently to the horizontal and vertical directions, respectively.

In this connection, as is known to those skilled in the art, the bandwidth of a system for handling a two-dimensional (vertical/horizontal) sampled image signal can be represented in the spatial domain by a two-dimensional frequency response as represented in FIG. 3 of the accompanying drawings. In FIG. 3, the horizontal axis represents a scale of horizontal spatial frequency in the positive and negative senses (H+ and H−) in units of cycles per picture (image) width, the vertical axis represents a scale of vertical spatial frequency in the positive and negative senses (V+ and V−) in units of cycles per picture (image) height, the rectangle 14 represents the two-dimensional bandwidth of the system, and the dimensions 16 and 18 represent the vertical and horizontal bandwidths, respectively. If the system comprises a 2D-FIR filter the vertical and horizontal bandwidths can be controlled in a manner known per se by varying the values of the weighting coefficients.

As indicated above, for a 2D-FIR filter of a particular configuration the bandwidth can be varied by altering the values of the weighting coefficients. However, if the bandwidth is to be varied over a large range, for example over the range from fs/2 to fs/200 quoted above, and if the filter response is to be a reasonable approximation to the ideal response over the whole range, a very large number of taps is required. Accordingly, since, for each direction, the amount of hardware is approximately proportional to the number of taps, the disadvantage arises that the filter would be very large and expensive. An object of the present invention is to overcome or at least to reduce this disadvantage.

SUMMARY OF THE INVENTION

The present invention provides a two-dimensional finite impulse response (FIR) filter arrangement for filtering a signal that represents an image and comprises a sequence of digital words spaced in time by an interval T. The filter arrangement comprises a two-dimensional FIR filter operative during each of a plurality of successive clock periods equal to T to effect filtration over a predetermined area of the image by processing a set of words of the image signal having a predetermined spatial relationship to produce therefrom an intermediate word, and storage means for storing at least some of the intermediate words produced during the successive clock periods. The filter arrangement further comprises control means responsive to a signal indicating an extent to which the image is to be compressed to:

(i) cause the FIR filter to adopt a bandwidth which is reduced, with respect to a value of the bandwidth for zero compression, by an extent related to the extent of compression, and (ii) cause a plurality of the intermediate words, the size of which plurality is related to the extent of compression, to be combined so as to produce output words representative of filtration over a larger area of the image which is a multiple of the above-mentioned predetermined area.

As is explained in more detail below, the present invention takes advantage of the fact that, when an image signal is to be subjected to substantial compression, some of the samples or words thereof are not needed. Accordingly, the present 2D-FIR filter arrangement produces output words which each comprise a combination of intermediate words generated during respective clock periods. Thus, each output word is representative of filtration over an area of the image which is a multiple of the predetermined area corresponding to the set of words processed during each clock period. In other words, each output word effectively is equivalent to a word which would have been obtained if the number of taps of the 2D-FIR filter had been increased by the same multiple. Thus, the filter arrangement operates as if the number of taps is increased as the extent of compression (compression factor) is increased. Therefore, effectively by what could be termed "recycling" of the hardware, a filter arrangement comprising a filter having a number of taps sufficient for use in the case of zero or a low extent of compression can function effectively over a wide range of compression factors where, with a conventional filter, many more taps would be needed to provide a satisfactory response.

The above, and other objects, features and advantages of this invention will be apparent from the following detailed description of illustrative embodiments which is to be read in connection with the accompanying drawings.

BRIEF DESCRIPTION OF THE DRAWINGS

FIG. 9 illustrates how the samples of an input signal are processed by the filter arrangement of FIG. 5 when it is in a zero/low compression mode;

FIG. 10 illustrates how the samples of an input signal are processed by the filter arrangement of FIG. 5 when it is in a 2:1 horizontal compression mode;

FIG. 11 illustrates how the samples of an input signal are processed by the filter arrangement of FIG. 5 when it is in a 2:1 vertical compression (no horizontal compression) mode;

FIG. 12 illustrates how the samples of an input signal are processed by the filter arrangement of FIG. 5 when it is in a 2:1 vertical and horizontal compression mode;

DESCRIPTION OF THE PREFERRED EMBODIMENTS

Figure 4:
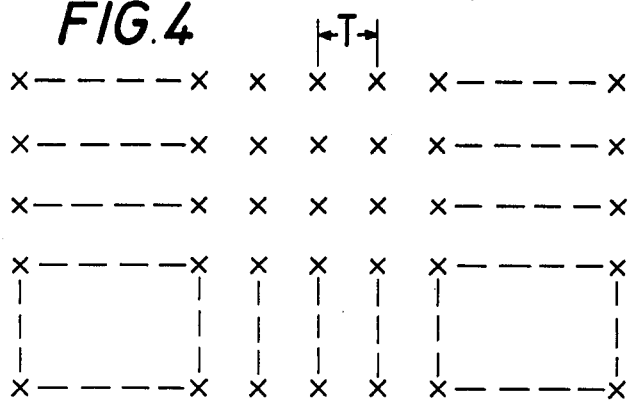
FIG. 4 is a representation in array form of samples making up a sampled image signal.

FIG. 4 of the drawings represents a two-dimensional digital image signal obtained by digitizing an analog signal (for example a television or video signal) produced by scanning an image in a line-sequential manner. Specifically, the digital signal is obtained by sampling the analog signal at a sampling frequency fs, that is at predetermined intervals T (where T=1/fs), to produce words or samples (for example 8-bit words or samples) spaced in time by the interval T. The crosses in the top row represent the words or samples of a first (scanning) line of the image and are spaced by the interval T in a direction which corresponds to the directin of scanning of the image and is considered to be horizontal. The number of samples per line will be predetermined for a particular system and may, for example, be equal to 864. The samples making up the first line are followed by a like number of samples (the second row down in FIG. 4) representing the next line of the image, and so on until the array shown in FIG. 4 (which corresponds, for example, to a frame or field of a television signal) is completed. As will be apparent, any two of the words in FIG. 4 which are adjacent in the vertical direction, namely the direction transverse to the direction of scanning of the image, are spaced apart by an interval equal to the sampling interval T multiplied by the number of samples per line.

Figure 5:
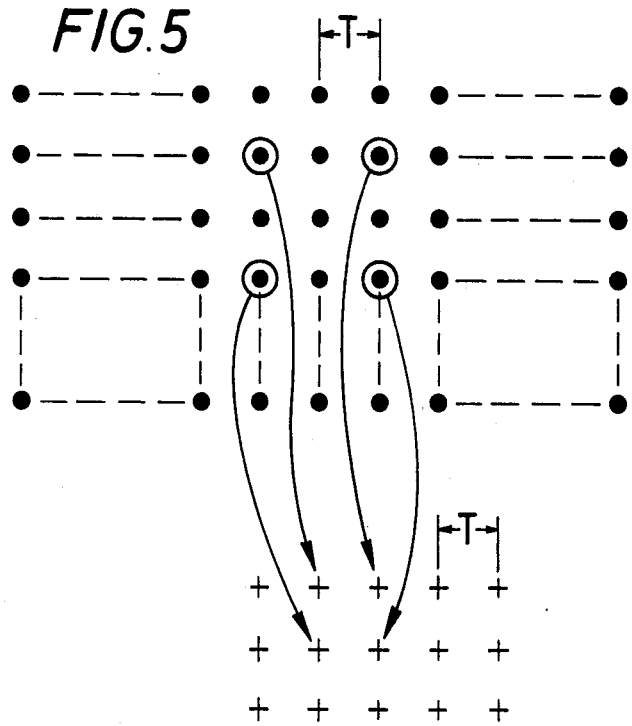
FIG. 5 is a representation corresponding to FIG. 4 of the samples of the image signal after they have been filtered by a conventional 2D-FIR filter, showing how certain samples only of the filtered array are required by the image compression means.

Suppose that the image signal represented in FIG. 4 is filtered by a conventional 2D-FIR filter whose bandwidth is such as to prevent the occurrence of aliasing in the manner described above due to a compression operation conducted after the signal has been filtered. After filtration, the signal will be as represented in FIG. 5, where each filtered sample or word is represented by a dot. As will be seen, there is a one-to-one correspondence between the filtered array of FIG. 5 and the filter input array shown in FIG. 4. That is to say, during each clock period equal to T the filter will have computed a respective output word or sample or, in other words, the filter produces one output sample for every input sample. However, if the image is to be compressed substantially, many of these calculations will have been unnecessary or redundant. Consider, for example, a case where the image is to be compressed by a factor of 2:1 in both the horizontal and vertical directions. To make up the compressed picture, the means for carrying out the compression (for example a digital video effects unit) selects only every other sample or word (in both the horizontal and vertical directions) of the array shown in FIG. 5 to make up an output (compressed) array. This is represented in FIG. 5 for a small area of the filtered array, from which it can be seen that only those words or samples of the filtered shown array encircled are used in making up an output array represented by crosses signifying the words of a compressed signal which are spaced by the interval T in the horizontal direction. That is, vertical compression results in whole lines of calculations (every other line in the case of 2:1 compression) being redundant; and horizontal compression results in some of the calculations in the useful lines (every other one in the case of 2:1 compression) being redundant.

Thus, three quarters of the computations effected in the 2D-FIR filter are redundant or unnecessary, since only $\frac{1}{2} \times 2$ of the output words of the filter are used by the compression means. More generally, if the image is to be compressed horizontally by a horizontal compression factor HCF and vertically by a vertical compression factor VCF, only 1/(HCF×VCF) of the output words are employed by the compression means. The unnecessary or redundant computation time therefore increases as the extent of compression is increased (and the bandwidth of the filter is reduced to prevent aliasing).

A 2D-FIR filter arrangement embodying the present invention and described hereinbelow takes advantage of the redundant computation time in that it produces only the number of output words that is appropriate to the extent of compression required, and uses the time that otherwise would have been employed in calculating redundant words to calculate the words that are in fact required, so as effectively to calculate the required output words over a greater number of taps than that afforded by its basic configuration so as to provide a response that more closely approaches the ideal response than otherwise would have been the case.

Figure 6:
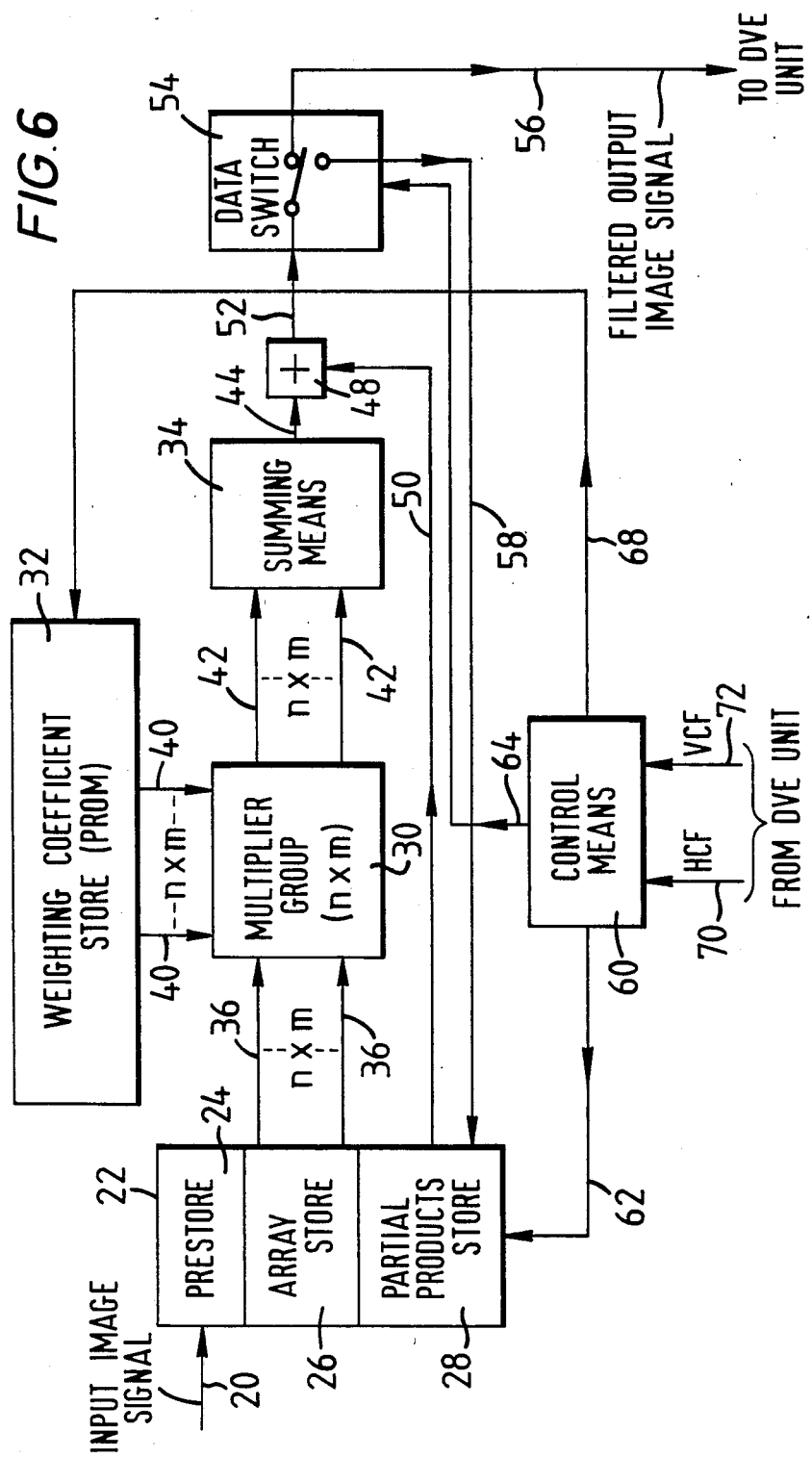
FIG. 6 is a block schematic view of a 2D-FIR filter arrangement embodying the present invention.

The 2D-FIR filter arrangement embodying the invention is shown in block diagram form in FIG. 6. As shown therein, an input image signal (of the form described above), which is present on a line 20, is applied to a memory 22 which is divided into a prestore 24, an array store 26 and a partial products store 28. As indicated above, the input image signal on the line 20 comprises a sequence of digital samples spaced by intervals T, where T=1/fs. The samples comprise multi-bit words (for example 8-bit words), the bits of which generally will arrive in parallel at the frequency (sampling rate) fs. Also, the bits of various words produced internally of the arrangement depicted in FIG. 6 generally are transferred between the various elements of the arrangement in parallel. Further, the bits of each output word of the arrangement of FIG. 6 generally will be generated in parallel. Accordingly, it will be appreciated that items shown or described in FIG. 6 (and in subsequent figures) as lines generally will in practice be in the form of busses or highways.

The prestore 24, array store 26 and partial products store 28 of the memory 22 each comprise a plurality of line stores, as described in more detail hereinbelow, a line store being a store that can contain a number of words or samples of the input image signal equal to the number of samples per line of the image, for example 864.

Figure 7:
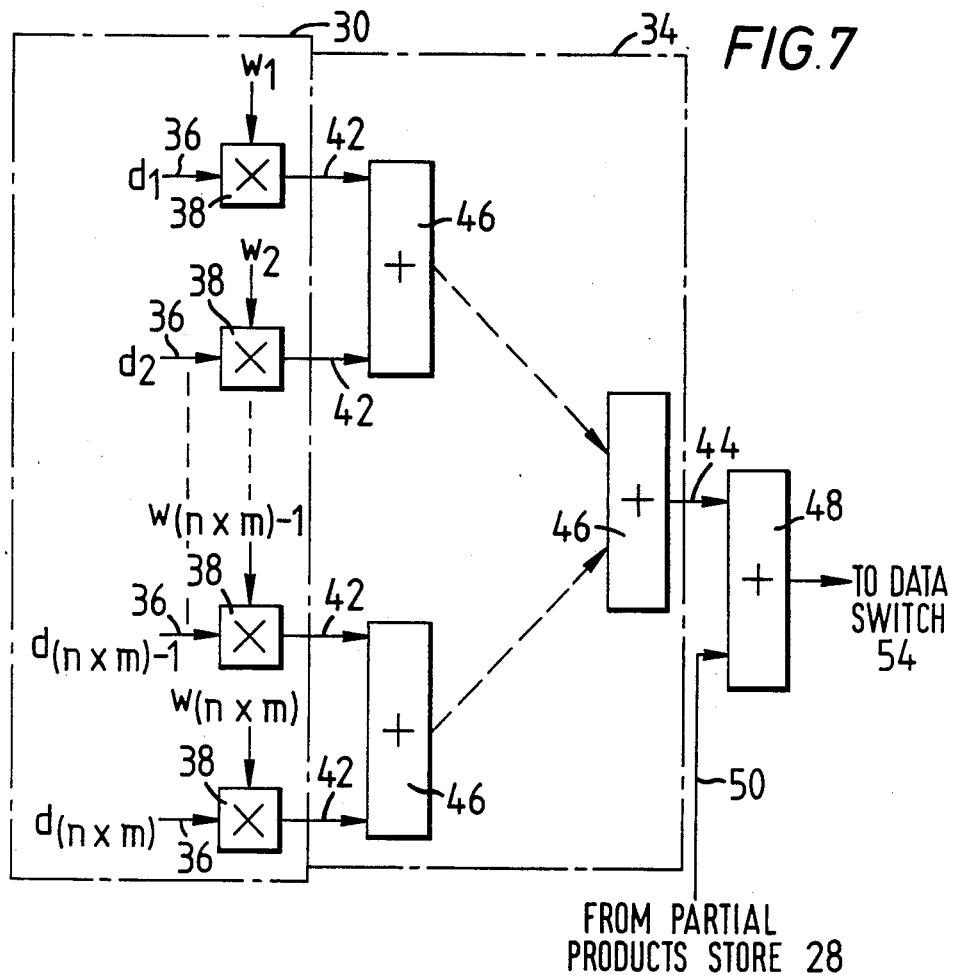
FIG. 7 is a more detailed view of a multiplier group and summing means of the filter arrangement of FIG. 6.

The array store 26, a multiplier group 30, a weighting coefficient store 32 and a summing means 34 cooperate with one another to form a 2D-FIR filter. As indicated above, and as is known to those skilled in the art, a 2D-FIR filter is operative during each successive clock period equal to T to filter the image signal over a predetermined area of the image. It does this by calculating an output word or sample during each successive clock period by multiplying a predetermined set of vertically and horizontally spaced samples of the input signal having a predetermined spatial relationship by respective weighting coefficients and summing the products of the weighting coefficients. In the present filter, the array store 26 is operative to produce the necessary temporal delays to achieve the desired spatial relationship of the predetermined set of input samples. Specifically, at each clock period, the array store 26 assembles a set of input samples in the form of a two-dimensional array of samples, forming the above-mentioned predetermined area of the image, the array having the dimensions n and m in the horizontal and vertical directions, respectively, and applies the $n \times m$ samples simultaneously (in parallel) to the multiplier group 30 via $n \times m$ lines 36. Referring now also to FIG. 7, in the multiplier group 30 the $n \times m$ samples $d_o$ to $d_{(n \times m)}$ are applied to respective ones of $n \times m$ multipliers 38 where they are multiplied with respective ones of $n \times m$ weighting coefficients $w_1$ to $w_{(n+m)}$ supplied from the weighting coefficient store 32 via $n \times m$ lines 40. The product words generated by the multipliers 38 are passed via $n \times m$ lines 42 to the summing means 34 where they are summed together so that, for each clock period, an output word of the filter is generated on a line 44.

For reasons that will become apparent later, the output words of the filter as produced on the line 44 at the frequency fs of the input signal are considered to be "intermediate words" or "partial products" of the overall filter arrangement of FIG. 6.

Figure 8:
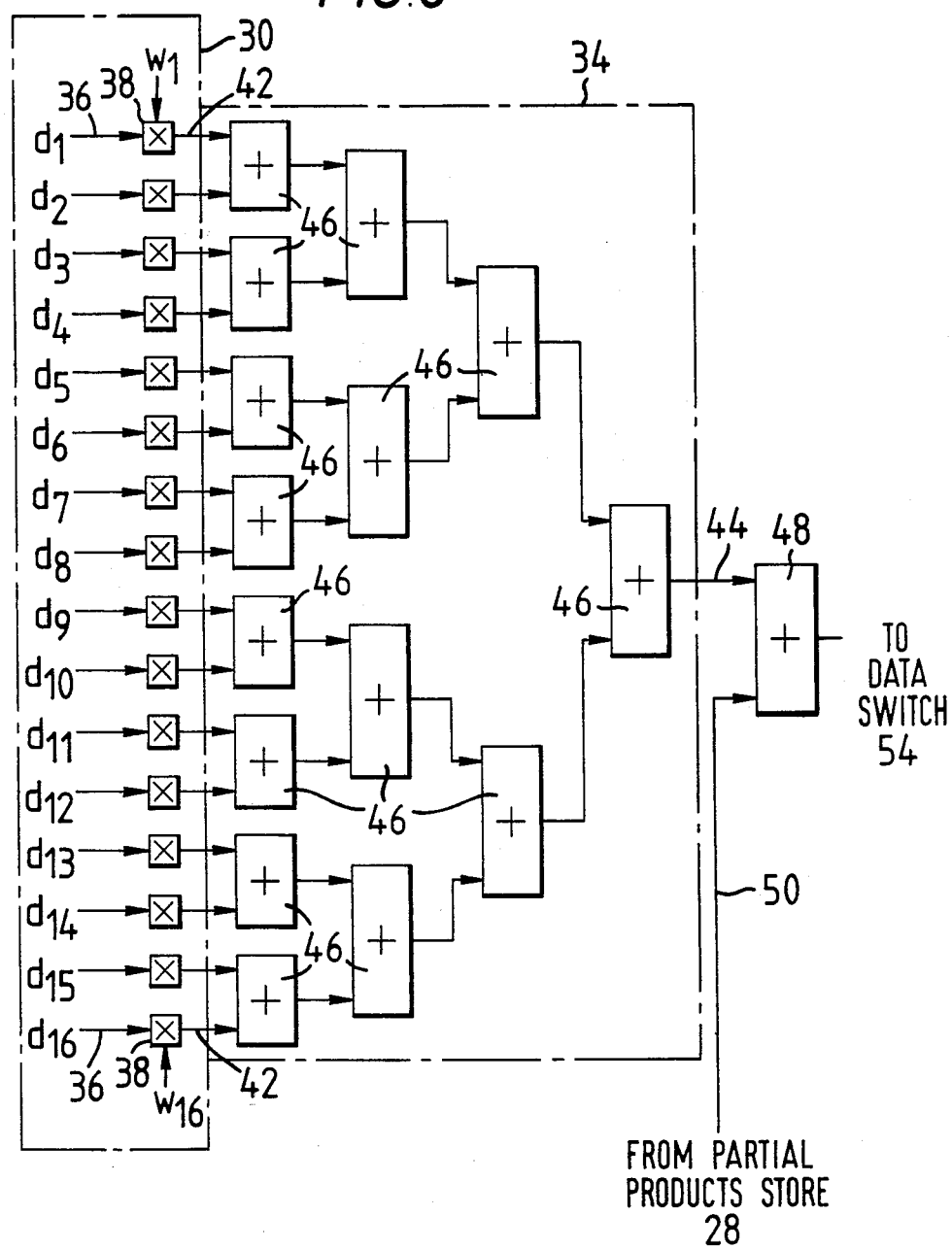
FIG. 8 is a view, corresponding to FIG. 7, of a specific form of the structure shown in FIG. 7 for a specific configuration of a 2D-FIR filter of the 2D-FIR filter arrangement of FIG. 6.

The summing means 34 may comprise a converging arrangement of two-input adders 46. The arrangement of the adders 46 (and the remainder of the circuitry shown in FIG. 7) may more readily be comprehended from an inspection of FIG. 8, which corresponds to the circuitry of FIG. 7, but is drawn in full for a specific example of a 4×4 square array, that is for a case in which n=m=4.

The intermediate words on the line 44 are passed to one input of an adder 48, another input of which is connected via a line 50 to the partial products store 28. An output of the adder 48 is connected via a line 52 to an input of a data switch 54 which, for ease of comprehension, is represented as a mechanical switch. The data switch 54 is capable of adopting two positions. In the illustrated position, the data switch 54 connects the line 52 to an output line 56 which is connected to a digital video effects (DVE) unit (not shown) which is capable of compressing the image. In the other position of the data switch 54, the line 52 is connected to a line 58 that leads back to the partial products store 28.

A control means 60 is connected by lines 62, 64 and 68 to the memory 22, the data switch 54 and to the weighting coefficient store 32, respectively, to cause these elements to operate in the manner described hereinbelow in detail. The control means 60 receives input signals on lines 70 and 72 from the DVE unit. The signal on the line 70 represents the abovementioned horizontal compression factor HCF, namely the extent to which the DVE unit wishes to compress the image in the horizontal direction. Likewise, the signal on the line 72 represents the above-mentioned vertical compression factor VCF, namely the extent to which the DVE unit wishes to compress the image in the vertical direction. The compression factors HCF and VCF can be generated by the DVE unit in a manner known per se. Each of the factors HCF and VCF may or may not vary over the area of the image.

The control means 60 is responsive to the signals representing the compression factors HCF and VCF to detect, for each direction, in which of a plurality of ranges the compression factor lies, and to cause the filter arrangement to operate in a mode appropriate to the detected ranges. The weighting coefficient store 32, which conveniently is in the form of a programmable read only memory (PROM), has stored therein a plurality of sets of $n \times m$ weighting coefficients. Having selected a mode, the control means 60 is effective on the weighting coefficient store 32, via the line 68, to cause loading into the multiplier group 30 during each clock period of one of the stored sets of $n \times m$ weighting coefficients which will cause the horizontal and vertical bandwidths of the filter to be such that, as described above with reference to FIGS. 1 and 2A to 2D, aliasing due to compression will be avoided or at least reduced. Note, however, that the same set of $n \times m$ weighting coefficients is not, for a particular mode, applied to the multiplier group 30 during every clock cycle. In fact, the number of sets employed in a particular mode will correspond to the number of $n \times m$ arrays which effectively are combined, as described below, in that mode to form a larger array, whereby a separate weighting coefficient is available for each member of the larger array. That is, except for a zero/low compression mode described below, a plurality of $n \times m$ sets is used during each mode.

Via the line 64, the control means 60 is operative to switch the data switch 54 between its two positions for respective different clock periods in accordance with the selected mode.

Finally, via the line 62, the control means 60 is operative periodically on the partial products store 28 to cause it to pass a stored intermediate word (partial product) via the line 50 to the adder 48 to be added to an intermediate word (partial product) which has just been generated to produce an output word, this operation being controlled in accordance with the selected mode.

The control means 60 thus performs the following two functions.

(i) As just explained, the control means 60 causes the 2D-FIR filter to adopt a bandwidth in each direction which is reduced, with respect to the value of each bandwidth for zero compression, by an extent related to the compression factor (extent of compression). Therefore, as described above with reference to FIGS. 1 and 2A to 2D, as the compression factor is increased the filter bandwidth is reduced correspondingly so that the 2D spectrum of the signal emerging from the filter arrangement is caused to fall below the Nyquist limit frequency so that aliasing due to compression is avoided or is at least minimised.

(ii) The control means 60, in a manner described more fully below, causes a plurality of the intermediate words (partial products) produced by the filter, the size of which plurality is related to the compression factor, to be combined periodically to produce on the output line 56 output words which are representative of filtration over an area of the image which is a multiple of the predetermined area corresponding to the m'n sample array formed in the array store 26. Accordingly, only the output words needed by the DVE unit to assemble a compressed image are produced by the filter arrangement of FIG. 5. That is, the overall rate at which the output words are produced is less than the rate (fs) at which input signal words arrive, the overall output word rate decreasing as the compression factor is increased. The filter arrangement uses the time that otherwise would have been taken to calculate redundant output words to calculate the words that are required, so as effecitvely to calculate the required output words over a greater number of taps than the number of taps afforded by its basic configuration, namely n in the horizontal direction and m in the vertical direction, so as to provide a response that more closely approaches the ideal response than otherwise would have been the case. As the compression factor is increased (and the bandwidth is decreased) the effective number of taps, and thus the quality or power of the filter arrangement, is increased.

It is appropriate to observe at this point that the filter arrangement shown in FIG. 6 includes a clock pulse source (not shown) that generates clock pulses at the frequency fs(=1/T), the pulses being applied to the various elements shown in FIG. 6 to cause them to operate during successive clock periods in the manner described herein.

The operation of the filter arrangement of FIG. 6 will now be described in more detail by way of several examples. For convenience and simplicity of explanation, it will be assumed in all of the following examples that a 4×4 array is used (that is, n=m=4), whereby the multiplier group 30 and summing means 34 have the specific form shown in FIG. 7.

1. ZERO/LOW COMPRESSION

The control means 60 determines that the filter arrangement should operate in a zero/low compression mode if the values of both the vertical and horizontal compression factors VCF and HCF lie between 1:1 (zero compression) and 2:1. The control means 60 causes the data switch 54 to remain all the time in the illustrated position. Also, the control means 60 does not cause the passage of data from the partial products store 28 to the adder 48 so that the intermediate words pass through the adder unaltered. Further, the control means 60 causes selection from the family stored in the store 32 of a set of 16(n×m) weighting coefficients that will ensure, even for the maximum compression permitted in this mode, that the bandwidth of the filter will be such that aliasing due to compression is avoided or at least minimized. This same set of 16 weighting coefficients is applied to the multiplier group during each successive clock period or cycle.

The prestore 22 is not used on this mode. At each clock period, the array store 26 loads a 4×4 array of 16 samples or words of the input signal into the multiplier group 30. The filter arrangement operates in this mode in a similar manner to a conventional 2D-FIR in that the words of the array are multiplied by their respective weighting coefficients in the multiplier group 30 and the product words are summed in the summing means 34 to produce an intermediate word, the successive intermediate words being passed directly via the adder 48 and data switch 54 to the output line 56. Thus, in this mode, the output words are the intermediate words and are produced at the same frequency (fs) as that at which the input words arrive. Intermediate words are not combined. Each successive output word is obtained by processing successive 4×4 arrays of input words spaced in the horizontal direction by one word, such as those designated A1, A2 and A3 in FIG. 9.

2. 2:1 HORIZONTAL COMPRESSION

The control means 60 causes the filter arrangement to switch into this mode when it detects that the horizontal compression factor HCF has a value greater than 2:1 (but less than 3:1).

In this mode, an output word corresponding to filtration over an 8×4 (2n×m) sample array is produced at every alternate clock period. To this end, the same 4×4 array of 2 input words or samples is presented to the multiplier group 30 during a cycle comprising two consecutive clock periods. However, the set of 16 weighting coefficients employed will of course vary in dependence upon whether that 4×4 array is to form the left-hand or right-hand half of an 8×4 array. Thus, the control means 60 causes the store 32 to supply two different sets of 16 weighting coefficients to the multiplier group during alternate clock cycles. Naturally, in this and in all other modes, the values of the weighting coefficients are of course such as to cause the adoption of a restricted bandwidth which will prevent or at least reduce aliasing due to compression.

At the end of each cycle of two clock periods, the array store 26 loads into the multiplier group 30 a further 4×4 array of input words, this further array being displaced in the horizontal direction by two words with respect to the previous array. This process is repeated indefinitely.

Of the two intermediate words generated in each cycle comprising two clock periods, one is fed back to the partial products store 28 via the data switch 54 and the line 58. The other is combined in the adder 48 with a previous intermediate word retrieved from the partial products store 28 via the line 50 to form an output word (corresponding to filtration over an 8×4 array comprising two horizontally adjacent 4×4 arrays) which is passed to the output line 56. The control means 60 controls the data switch 54 and partial products store 28 to make these operations take place.

The foregoing process can more readily be understood by referring to FIG. 10. During the first cycle of two clock periods under consideration, the 4×4 array A1 is processed twice (with different sets of 16 weighting coefficients each time) to produce a pair of intermediate words W1a and W1b. The intermediate word W1a is combined in the adder 48 with an intermediate word previously stored in the partial products store 28 to form an output word which is passed via the data switch 54 to the output line 56. The intermediate word W1b is passed products store 28 via the data switch 54 and the line 58, no output word being generated during the corresponding clock period. During the next cycle of two clock periods, the 4×4 array A3 is processed twice (with the same two different sets of 16 weighting coefficients as in the first cycle) to produce a pair of intermediate words W3a and W3b, the intermediate word W3a being combined with a previously stored intermediate word in the adder 48 to produce an output word and the intermediate word W3b being sent to the partial products store 28. This process continues, and is illustrated for a number of consecutive clock periods by Table 1 below.

TABLE I

| Clock period | 4 × 4 array processed | Intermediate word generated | Intermediate word sent to store | Intermediate words combined to produce output word (corresponding 8 × 4 array) |
|---|---|---|---|---|
| 1 | A1 | W1a | — | previous + W1a (previous + A1) |
| 2 | A1 | W1b | W1b | — |
| 3 | A3 | W3a | — | previous + W3a (previous + A3) |
| 4 | A3 | W3b | W3b | — |
| 5 | A5 | W5a | — | W1b + W5a (A1 + A5) |
| 6 | A5 | W5b | W5b | — |
| 7 | A7 | W7a | — | W3b + W7a (A3 + A7) |
| 8 | A7 | W7b | W7b | — |
| 9 | A8 | W9a | — | W5b + W9a (A5 + A9) |
| 10 | A8 | W9b | W9b | — |

It can clearly be seen from Table 1 how an output word effectively produced over a number of taps (8) in the horizontal direction which is twice that (4) provided by the basic configuration of the filter arrangement is generated at every alternate clock period; and that those words which, due to compression, are not required, namely those based on the arrays between the illustrated arrays A1,A3 etc., are not generated, the clock periods during which those words otherwise would have been generated being used to generate intermediate words for combination with other intermediate words to form the output words that are based on 8×4 arrays.

It can also be seen from the right-hand column of Table 1 that, in this mode, the quantity of storage employed in the partial products store 28 amounts only to that required for two intermediate words or samples.

3. 3:1 HORIZONTAL COMPRESSION

The control means 60 causes the filter arrangement to switch into this mode when it detects that the horizontal compression factor HCF has exceeded 3:1.

In this mode, an output word corresponding to filtration over a 12×4 (3n×m) sample array is produced for every third clock period. Contrary to mode 2, however, a different 4×4 array of input words or samples is presented to the multiplier group during each clock period, the successive arrays being spaced by one word in the horizontal direction, as in mode 1. However, contrary to mode 1, three different sets of 16 weighting coefficients are employed in turn over a cycle comprising three clock periods. This is necessary because the three 4×4 arrays processed in the three consecutive clock periods making up the cycle are destined to form the left-hand, central and right-hand portions of a 12×4 array on which the corresponding output word is based, whereby 16×3 (=12×4) individual weighting coefficients are required.

The process carried out in this mode can readily be comprehended from a study of Table 2 below.

TABLE 2

| Clock period | 4 × 4 array processed | Intermediate word generated | Intermediate word sent to store | Intermediate words combined to produce output word (corresponding 12 × 4 array) |
|---|---|---|---|---|
| 1 | A1 | W1 | W1 | — |
| 2 | A2 | W2 | W2 | — |
| 3 | A3 | W3 | — | two previous + W3 (two previous + A3) |
| 4 | A4 | W4 | W4 | — |
| 5 | A5 | W5 | W5 | — |
| 6 | A6 | W6 | — | previous + W2 + W6 (previous + A2 + A6) |
| 7 | A7 | W7 | W7 | — |
| 8 | A8 | W8 | W8 | — |
| 9 | A9 | W9 | — | W1 + W5 + W9 (A1 + A5 + A9) |
| 10 | A10 | W10 | W10 | — |
| 11 | A11 | W11 | W11 | — |
| 12 | A12 | W12 | — | W4 + W8 + W12 (A4 + A8 + A12) |

As can be seen from Table 2, the clock periods 1 to 3, 4 to 6, 7 to 9 etc. correspond to the cycles during which the 4×4 arrays processed correspond, respectively, to the left-hand, central and right-hand portions of the 12×4 array on which an output word is based.

It can clearly be seen from Table 2 how an output word effectively produced over a number of taps (12) in the horizontal direction which is three times that (4) provided by the basic configuration of the filter arrangement is generated at every third clock period.

It can also be seen from the right-hand column of Table 2 that, in this mode, the quantity of storage employed in the partial products store 28 amounts only to that required for five intermediate words or samples.

Finally, it can be seen from Table 2 that, in this mode, the control means 60 causes some intermediate words to be added to previous intermediate words and the resultant sums to be added to subsequently generated intermediate words to generate output words. For instance, W1 is added to W5, the sum is stored, and the sum is added later to W9 to produce an output word. W1 and W5 can be summed in the adder 48 by passing W1 back from the store 28 to the adder W5 as W5 is generated, the summed word being directed back to the store 28 by the data switch 54. Naturally, such intermediate summations of intermediate words will be necessary also when the horizontal compression factor is greater than in the present mode.

4. GREATER HORIZONTAL COMPRESSION

It should be appreciated that the techniques described under modes 2 and 3 above can be extended to deal with higher values of the horizontal compression factor HCF. The threshold values of HCF at which, as it increases, the filter arrangement steps into a different mode, may generally be selected as desired. It is possible to step into a different mode each time that HCF is incremented by unity, that is each time that it is incremented from N:1 to (N+1):1 where N is equal to 2 or any higher integer. However, particularly for higher values of N, it is possible for the mode not to be stepped each time HCF is incremented by unity. It may for example be satisfactory to step into a different mode each time that HCF increases to a value such that the bandwidth of the filter arrangement is reduced by one octave with respect to its value for the previous (larger bandwidth) mode.

It will be appreciated also that, in the case of horizontal compression only, the storage demands made on the partial products store 28 are minimal. That is, it is in general necessary to store only a few partial products (intermediate words) for a time which is much less than the length of a line. As will be explained below, the demands made on the partial products store 28 in the case of vertical compression are more extensive.

5. 2:1 VERTICAL COMPRESSION-NO HORIZONTAL COMPRESSION

The control means 60 causes the filter arrangement to switch into this mode when it detects that the vertical compression factor VCF is greater than 2:1 (but less than 3:1) and the horizontal compression factor is less than 2:1.

The filter arrangement operates in this mode in a manner closely analogous to the 2:1 horizontal compression mode (mode 2), except that in this case each output word is based on a 4×8 (n×2 m) array comprising two vertically adjacent 4×4 arrays (for example two arrays designated A(1,1) and A(1,5) in FIG. 11) rather than being based on an 8×4 (2n×m) array comprising two horizontally adjacent 4×4 arrays (for example the arrays A1 and A5 of FIG. 10). Since vertically adjacent 4×4 arrays are spaced temporally by a plurality of lines (rather than by a plurality of clock periods), the operation of the filter arrangement in the case of vertical compression differs from the operation in the case of horizontal compression in three respects. Firstly, the intervals employed in calculating intermediate words or partial products which are sent to storage comprise multiples of whole lines. (Therefore, in the case of 2:1 vertical compression, not output words are produced during alternate lines). Secondly, since partial products are generated for a whole line, the partial products store 28 must have a capacity of at least one line (in fact, in the present exemplary mode, at least two lines). Thirdly, since (as explained below) the filter makes two passes through groups of four lines, the prestore must be capable of serving as a buffer store to accumulate for subsequent use that part of the input signal that arrives during this process.

The operation of the filter in this mode will now be described with reference to FIG. 11. The filter processes to arrays shown at A(1,1), A(2,1), A(3,1) etc. in FIG. 11, namely those arrays obtained by shifting through lines 1 to 4 of FIG. 11 by increments of one clock period (one word or sample) in the horizontal direction. During this process, a set of 16 weighting coefficients corresponding to the lower half of the 4×8 array on which the output words are based is employed during each clock period. The intermediate word produced at each clock period is combined with a stored intermediate word corresponding to the vertically adjacent 4×4 array to produce an output word based on a 4×8 array. Therefore, during this process, which takes up one full line, an output word is produced for every clock period.

The filter processes the same arrays (lines 1 to 4) again, but using a different set of 16 weighting coefficients corresponding to the upper half of the 4×8 array. All of the intermediate words produced in this process, which take up one full line, are stored in the partial products store 28, and no output words are produced.

The filter then jumps two lines and performs two like processes on line 3 to 6 of FIG. 11 (starting with the array A(1,3)), thereby again producing intermediate words for storage (but no output words) during one line and producing an output word at each clock period during another line.

The filter then jumps two further lines and performs the same pair of processing operations on lines 4 to 8 in FIG. 11 (starting with the aray (1;5); and so on.

It will be seen from the foregoing that up to two lines of storage are needed in the partial products store 28 at any one time. It will also be seen from the foregoing that at least one line of storage is needed in the prestore 22 for storing input data that arrives while other data is being processed. For example, during the second processing operation performed on lines 1 to 4, line 5 arrives and is stored for use during the next two processes, namely those performed on lines 3 to 6. (Line 6 can, as described below, be fed directly into an appropriate line store of the array store 26 as it arrives).

The operation of this mode may be understood more clearly from a study of Table 3 below. In Table 3, the code "L (number) sa (or sb)" indicates a line of intermediate words (sub-total) produced as described above. The number following "L" (line) indicates to which of a sequence of lines of output words (formed by combining the words of lines of intermediate words) that line of intermediate words belongs. The letter "a" or "b" following "s" (sub-total) indicates which of the two operations making up the pair of processing operations mentioned above led to the generation of that line of intermediate words, that is, whether that line comprises intermediate words corresponding to the upper or lower halves of 4×8 arrays. (A similar convention is used in Tables 4 to 6 appearing hereinbelow). Thus, for example, the first line of output words would be formed by combining the words of the sub-totals (lines of intermediate words) L1sa and L1sa, where, referring to FIG. 11, the sub-total L1sa comprises the intermediate words formed by processing the arrays A(1,1) etc. (lines 1 to 4) with the set of weighting coefficients corresponding to the upper half of the 4×8 array and the sub-total L1sb comprises the intermediate words formed by processing the arrays A(1,5) etc. (lines 5 to 8) with the set of weighting coefficients corresponding to the lower half of the 4×8 array.

TABLE 3

| Line Number | Line stored in prestore 22 | Lines supplied by array store 26 | Sub-total generated | Previous sub-total added to generated sub-total | Output words generated? | Sub-totals held in partial products store 28 |
|---|---|---|---|---|---|---|
| 1 | | | | | | |
| 2 | | | | | | |
| 3 | | | | | | |
| 4 | | 1,2,3,4 | | | YES | |
| 5 | 5 | 1,2,3,4 | L1sa | | | |
| 6 | | 3,5,5,6 | | | YES | |
| 7 | 7 | 3,4,5,6 | L2sa | | | L2sa |
| 8 | | 5,6,7,8 | L1sb | L1sa | YES | L2sa |
| 9 | 9 | 5,6,7,8 | L3sa | | | L3sa L2sa |
| 10 | | 7,8,9,10 | L2sb | L2sa | YES | L3sa |
| 11 | 11 | 7,8,9,10 | L4sa | | | L4sa L3sa |
| 12 | | 9,10,11,12 | L3sb | L3sa | YES | L4sa |

It can be seen from Table 3 that the maximum number of line stores required for this particular configuration in this particular mode in any one line is one for the prestore 24, four for the array store 26 and two for the partial products store 28, making a total of seven line stores. (See, for example, lines 9 and 11). With the provision of these seven line stores, a filter having a basic 4×4 configuration is modified to form a filter arrangement that effectively has a 4×8 configuration.

6. 2:1 VERTICAL AND HORIZONTAL COMPRESSION

The control means 60 causes the filter arrangement to enter this mode when it detects that both the vertical and horizontal compression factors are greater than 2:1, but less than 3:1.

In this mode, each output word is based upon an 8×8 array corresponding to four adjacent 4×4 arrays, for example those designated A(1,1), A(5,1), A(1,5) and A(5,5) in FIG. 12. As in mode 5 (2:1 vertical compression with no horizontal compression), no output words are produced during alternate lines. In the other lines, as in mode 2 (2:1 horizontal compression), output words are produced only at alternate clock periods. Thus, this mode comprises a combination of modes 2 and 5, and might for example be performed as follows. As in mode 5, lines 1 to 4 are processed twice. However, contrary to mode 5, the arrays processed in this mode are not all of the arrays A(1,1), A(2,1), A(3,1) etc. Instead, as in mode 2, only the alternate arrays A(1,1), A(3,1), A(5,1) etc are processed, each such array being processed twice (during two consecutive clock periods or cycles) with respective different sets of 16(4×4) weighting coefficients to produce two intermediate words. In like manner to mode 5, the lines 1 to 4 are processed twice. Thus, each alternate 4×4 array A(1,1), A(3,1) etc., is processed four times altogether with four different sets of weighting coefficients, since each such 4×4 array will correspond to a respective different portion of four different 8×8 arrays on which four corresponding output words are based.

Consider the operation during which the filter processes the lines 1 to 4 for the first time. As explained above, each alternate array is processed twice (during two consecutive clock periods or cycles) to produce two intermediate words. One of these intermediate words or partial products is added in the adder 48 to a stored partial product retrieved from the partial products store 28, which stored partial product is the sum of three previous partial products corresponding to ¾ of an 8×8 array on which an output word is to be based, to produce the output word. The other intermediate word is added in the adder 48 to a stored partial product (the sum of two previous partial products corresponding to the upper half of an 8×8 array on which an output word is to be based) retrieved from the partial products store 28 and the sum or partial product resulting from the addition is returned to the partial products store. That partial product is retrieved from the partial products store 28 two clock periods later and added to a newly generated partial product to form an output word as just described. Thus, during this process, one output word is produced at every alternate clock period.

Consider now the operation during which the filter processes the lines 1 to 4 for the second time. Again, each alternate array is processed twice (during two consecutive clock periods or cycles) to produce two intermediate words. Each of these is sent to the partial products store 28 and retrieved therefrom two clock periods later to be added to a newly generated intermediate word and sent back to store. Thus, as in mode 5, no output words are produced during this second processing operation. Also as in mode 5, at the end of the operation the partial products store 28 stores a number of partial products produced from this operation, which number is equal to the number of samples per line. However, whereas in mode 5 each such stored partial product corresponds to the upper half (4×4) of a 4×8 array on which an output word is to be based, in the present mode each such stored partial product corresponds to the upper half (8×4) of an 8×8 array on which an output word is to be based. (It should be noted, incidentally, that it follows from this that the storage requirement imposed on the partial products store 28 is the same for 2:1 compression both horizontally and vertically as it is for 2:1 compression in the vertical direction only).

Three lines later, when lines 5 to 8 are processed for the first time, the partial products produced when lines 1 to 4 are processed for the second time are retrieved from the partial products store 28 and are used in the production of output words in a similar manner to that described above in connection with the first operation performed on lines 1 to 4. That is to say, each such partial product (which corresponds to the upper half of an 8×8 array) is recalled and added to a newly generated partial product to produce a new partial product which corresponds to ¾ of an 8×8 array, that new partial product is sent back to the store 28 and, two clock periods later, it is retrieved from the store 28 and added to a newly generated partial product to produce an output word.

The same principle as just described can be applied, mutatis mutandis, in the case of a greater degree of horizontal and/or vertical compression. Accordingly, the examples described below, all of which refer to vertical compression of greater than 2:1, do not describe also any attendant horizontal compression.

As indicated above, the amount of storage required in the partial products store 28 to cater for 2:1 vertical and horizontal compression is no greater than that required to cater for 2:1 vertical compression alone. Therefore, in the case of 2:1 compression in both the horizontal and vertical directions, the total storage requirement does not exceed the requirement of 7 line stores necessary in the case of 2:1 vertical compression with no horizontal compression.

The same remark applies to the cases of vertical compression by extents greater than 2:1 as described below. In none of these cases should the need to effect horizontal compression in addition to vertical compression lead to a storage requirement greater than the total number of lines stores indicated in the examples given below.

7. 3:1 VERTICAL COMPRESSION

The central means 60 causes the filter arrangement to enter this mode when it detects that the vertical compression factor VCF is greater than 3:1.

In this case, as should by now be evident, output words based upon 4×12 arrays (each formed by three vertically adjacent 4×4 arrays) are produced only during every third line, no output words being produced during the other lines. In those lines during which output words are produced, one word will be produced for every clock period in the case of less than 2:1 horizontal compression and a lesser number of words will be produced in the case of greater than 2:1 horizontal compression, in which latter case the horizontal size of the output array will of course be a multiple of 4.

In this mode, it is found that the prestore 24 is not required because it is not necessary (as in mode 5) to supply each group of four lines to the filter twice, that is for two consecutive lines of the input signal, and then to jump two lines ahead. Instead, the four lines supplied from the array store 26 to the multiplier group are incremented by one line for each line of the input signal.

The operation of this mode may be understood more clearly from a study of Table 4 below.

TABLE 4

| Line Number | Lines supplied by array store 26 | Sub-total generated | Previous sub-total added to generated sub-total | Output words generated? | Sub-totals held in partial products store 28 |
|---|---|---|---|---|---|
| 1 | | | | | |
| 2 | | | | | |
| 3 | | | | | |
| 4 | 1,2,3,4 | L1sa | | | |
| 5 | 2,3,4,5 | | | | |
| 6 | 3,4,5,6 | | | | |
| 7 | 4,5,6,7 | L2sa | | | |
| 8 | 5,6,7,8 | L1sb | L1sa | | |
| 9 | 6,7,8,9 | | | YES | |
| 10 | 7,8,9,10 | L3sa | | | L3sa |
| 11 | 8,9,10,11 | L2sb | L2sa | | L2sb L3sa |
| 12 | 9,10,11,12 | L1sc | L1sb | YES | L2sb L3sa |
| 13 | 10,11,12,13 | L4sa | | | L4sa L2sb L3sa |
| 14 | 11,12,13,14 | L3sb | L3sa | | L3sb L4sa L2sb |
| 15 | 12,13,14,15 | L2sc | L2sb | YES | L3sb L4sa |
| 16 | 13,14,15,16 | L5sa | | | L5sa L3sb L4sa |
| 17 | 14,15,16,17 | L4sb | L4sa | | L4sb L5sa L3sb |
| 18 | 15,16,17,18 | L3sc | L3sb | YES | L4sb L5sa |
| 19 | 16,17,18,19 | L6sa | | | |
| 20 | 17,18,19,20 | L5sb | L5sa | | |
| 21 | 18,19,20,21 | L4sc | L4sb | YES | |
| 22 | 19,20,21,22 | L7sa | | | |
| 23 | 20,21,22,23 | | | | |
| 24 | 21,22,23,24 | | | | |

As can be seen from Table 4, due to the fact that each output word is based on three 4×4 arrays the control means 60 causes some sub-totals (lines of intermediate words) to be added to previously generated and stored sub-totals and the resultant sub-totals to be added to subsequently generated sub-totals to generate lines of output words. For instance, with regard to output line 3, L3sa is generated and stored in line 10. L3sb is generated subsequently (in line 14) and the words thereof are added to those of L3sa (recalled from the store 28) as L3sb is generated, as in mode 6. However, in contrast to mode 5, the resultant sub-total (L3sa+L3sb) is not outputted to the output line 56, but is instead routed back to the store by the data switch 54. As L3sc is generated in line 18, the sub-total (L3sa+L3sb) is called back from the store 28 and the words thereof are added to L3sc to produce output line 3. Naturally, such intermediate summations of intermediate sub-totals will be necessary also when the vertical compression factor is greater than in the present mode.

As can be seen from Table 4, the maximum number of line stores required for this particular configuration in this particular mode in any one line is four for the array store 26 and three for the partial products store 28, making a total of seven line stores. With the provision of these seven line stores, a filter having a basic 4×4 configuration is modified to form a filter arrangement that effectively has a 4(at least)×12 configuration.

8. 4:1 VERTICAL COMPRESSION

The control means 60 causes the filter arrangement to enter this mode when it detects that the vertical compression factor VCF is greater than 4:1.

In this case, as should by now be evident, output words based upon 4×16 arrays (each formed by four vertically adjacent 4×4 arrays) are produced only during every fourth line, no output words being produced during the other lines. In those lines during which output words are produced, one word will be produced for every clock period in the case of less than 2:1 horizontal compression and a lesser number of words will be produced in the case of greater than 2:1 horizontal compression, in which latter case the horizontal size of the output array will of course be a multiple of 4.

In this mode, the prestore 24 is needed and should be capable of storing temporarily up to three lines of the input signal. This is necessary because, in this mode, each group of four lines is passed through the filter four times and the array store 26 then jumps four lines ahead, so that the intervening three lines must temporarily be stored.

The operation of this mode may be understood more clearly from a study of Table 5 below.

In this mode, the prestore 24 functions in exactly the same way as in mode 8 because, again as in mode 8, each group of four lines is passed through the filter four times and the array store 26 then jumps four lines ahead.

The operation in this mode may be understood more clearly from Table 6 below. The lines stored in the prestore 22 are omitted from Table 6 because, as indicated above, they are the same as in mode 8 and therefore the same as represented in Table 5. Also, for simplicity, the column of previous sub-totals added to generated sub-totals is omitted from Table 6, since the derivation of these should by now be obvious.

TABLE 5

| Line Number | Lines stored in prestore 22 | Lines supplied by array store 26 | Sub-total generated | Previous sub-total added to generated sub-total | Output words generated? | Sub-totals held in partial products store 28 |
|---|---|---|---|---|---|---|
| 1 | 1 | | | | | |
| 2 | 1 2 | | | | | |
| 3 | 1 2 3 | | | | | |
| 4 | | 1,2,3,4 | L1sa | none | | |
| 5 | 5 | 1,2,3,4 | | | | |
| 6 | 5 6 | 1,2,3,4 | | | | |
| 7 | 5 6 7 | 1,2,3,4 | | | | |
| 8 | | 5,6,7,8 | L2sa | none | | |
| 9 | 9 | 5,6,7,8 | L1sb | L1sa | | |
| 10 | 9 10 | 5,6,7,8 | | | | |
| 11 | 9 10 11 | 5,6,7,8 | | | | |
| 12 | | 9,10,11,12 | L3sa | none | | |
| 13 | 13 | 9,10,11,12 | L2sb | L2sa | | |
| 14 | 13 14 | 9,10,11,12 | L1sc | L1sb | | |
| 15 | 13 14 15 | 9,10,11,12 | | | | |
| 16 | | 13,14,15,15 | L4sa | none | | L4sa L1sc L2sb L3sa |
| 17 | 17 | 13,14,15,16 | L3sb | L3sa | | L3sb L3sa L1sc L2sb |
| 18 | 17 18 | 13,14,15,16 | L2sc | L2sb | | L2sc L3sb L4sa L1sc |
| 19 | 17 18 19 | 13,14,15,16 | L1sd | L1sc | YES | L2sc L3sb L4sa |
| 20 | | 17,18,19,20 | L5sa | none | | L5sa L2sc L3sb L4sa |
| 21 | 21 | 17,18,19,20 | L4sb | L4sa | | L4sb L5sa L2sc L3sb |
| 22 | 21 22 | 17,18,19,20 | L3sc | L3sb | | L3sc L4sb L5sa L2sc |
| 23 | 21 22 25 | 17,18,19,20 | L2sd | L2sc | YES | L3sc L4sb L5sa |
| 24 | | 21,22,23,24 | L6sa | none | | |

As can be seen from Table 5, the maximum number of line stores required for this particular configuration in this particular mode in any one line is three for the prestore 24, four for the array store 26 and three for the partial products store 28 (e.g. in line 19), or two for the prestore 24, four for the array store 26 and four for the partial products store 28 (e.g. in line 18), in both cases making a total of 10 line stores. With the provision of these ten line stores, a filter having a basic 4×4 configuration is modified to form a filter arrangement that effectively has a 4(at least)×16 configuration.

9. 8:1 VERTICAL COMPRESSION

The control means 60 causes the filter arrangement to enter this mode when it detects that the vertical compression factor is greater than 8:1.

In this case, as should by now be evident, output words based upon 4×32 arrays (each formed by eight vertically adjacent 4×4 arrays) are produced only during every eighth line, no output words being produced during the other lines. In those lines during which output words are produced, one word will be produced for every clock period in the case of less than 2:1 horizontal compression and a lesser number of words will be produced in the case of greater than 2:1 horizontal compression, in which latter case the horizontal size of the output array will of course be a multiple of 4.

TABLE 6

| Line Number | Lines supplied by array store 26 | Sub-total generated | Output words generated | Sub-totals held in partial products store 28 |
|---|---|---|---|---|
| 1 | | | | |
| 2 | | | | |
| 3 | | | | |
| 4 | 1,2,3,4 | L1sa | | |
| 5 | 1,2,3,4 | | | |
| 6 | 1,2,3,4 | | | |
| 7 | 1,2,3,4 | | | |
| 8 | 5,6,7,8 | L1sb | | |
| 9 | | | | |
| 10 | | | | |
| 11 | | | | |
| 12 | 9,10,11,12 | L2sa | | |
| 13 | | L1sc | | |
| 14 | | | | |
| 15 | | | | |
| 16 | 13,14,15,16 | L2sb | | |
| 17 | | Lsd | | |
| 18 | | | | |
| 19 | | | | |
| 20 | 17,18,19,20 | L3sa | | |
| 21 | | L2sc | | |
| 22 | | L1sc | | |
| 23 | | | | |
| 24 | 21,22,23,24 | L3sb | | |
| 25 | | L2sd | | |
| 26 | | L1sf | | |
| 27 | | | | |
| 28 | 25,26,27,28 | L4sa | | L4sa |

TABLE 6-continued

| Line Number | Lines supplied by array store 26 | Sub-total generated | Output words generated | Sub-totals held in partial products store 28 |
|---|---|---|---|---|
| 29 | | L3sc | | L3sc L4sa |
| 30 | | L2sc | | L2se L3sc L4sa |
| 31 | | L1sg | | L1sg L2sc L3sc L4sa |
| 32 | 29,30,31,32 | L4sb | | L4sb L1sg L2se L3sc |
| 33 | | L3sd | | L3sd L4sb L1sg L2sc |
| 34 | | L2sf | | L2sf L3sd L4sb L1sg |
| 35 | | L1sh | YES | L2sf L3sd L4sb |
| 36 | 33,34,35,36 | L5sa | | L5sa L2sf L3sd L4sb |
| 37 | | L4sc | | L4sc L5sa L2sf L3sd |
| 38 | | L3se | | L3se L4sc L5sa L2sf |
| 39 | | L2sg | | L2sg L3se L4sc L5sa |
| 40 | 37,38,39,40 | L5sb | | |
| 41 | | L4sd | | |
| 42 | | L3sf | | |
| 43 | | L2sh | YES | |
| 44 | 41,42,43,44 | L6sa | | |
| 45 | | L5sc | | |
| 46 | | L4se | | |
| 47 | | L3sg | | |
| 48 | 45,46,47,48 | L6sb | | |
| 49 | | L5sd | | |
| 50 | | L4sf | | |
| 51 | | L3sh | YES | |
| 52 | 49,50,51,52 | | | |

As can be seen from Table 6, bearing in mind that the contents of the prestore 24 are the same as in Table 5, the maximum line store requirement is the same as in mode 8, namely ten line stores. Thus, with the provision of these ten line stores, a filter having a basic 4×4 configuration is modified to form a filter arrangement that effectively has a 4(at least)×32 configuration.

10. GREATER VERTICAL COMPRESSION

It should be appreciated that the techniques described under modes 5 to 9 can be extended to deal with higher values of the vertical compression factor VCF. It is particularly important to note that the maximum line storage requirement of ten line stores derived in modes 8 and 9 represents a maximum or ceiling value. That is, for vertical compression factors which are still higher, no more than ten line stores should be required. Bearing in mind that, as indicated above, horizontal compression requires no additional partial product storage, it follows that the present configuration of filter arrangement can deal with indefinitely higher vertical and horizontal compression factors without requiring any more storage than that provided by the ceiling value of ten line stores.

The threshold value of the vertical compression factor VCF at which, as it increases, the filter arrangement steps into a different mode, may generally be selected as desired. It is possible to step into a different mode each time that VCF is incremented by unity, that is each time it is incremented from N:1 to (N+1):1, where N is equal to 2 or any higher integer. However, particularly for higher values of N, it is possible for the mode not to be stepped each time VCF is incremented by unity. It may for example be satisfactory to step into a different mode each time that VCF increases to a value such that the bandwidth of the filter arrangement is reduced by one octave with respect to its value for the previous (larger bandwidth) mode.

It should be noted that the variations of the horizontal and vertical compression factors can be effected independently of one another. That is, for a particular horizontal (or vertical) compression factor required by the DVE unit, the filter arrangement will respond appropriately to any vertical (or horizontal) compression factor required by the DVE unit.

In the light of the foregoing description, it should be evident to a person skilled in the art how the memory 22 may be configured. Nonetheless, for the sake of completeness, one form of implementing the memory 22 will now be described briefly with reference to FIG. 13.

Figure 13:
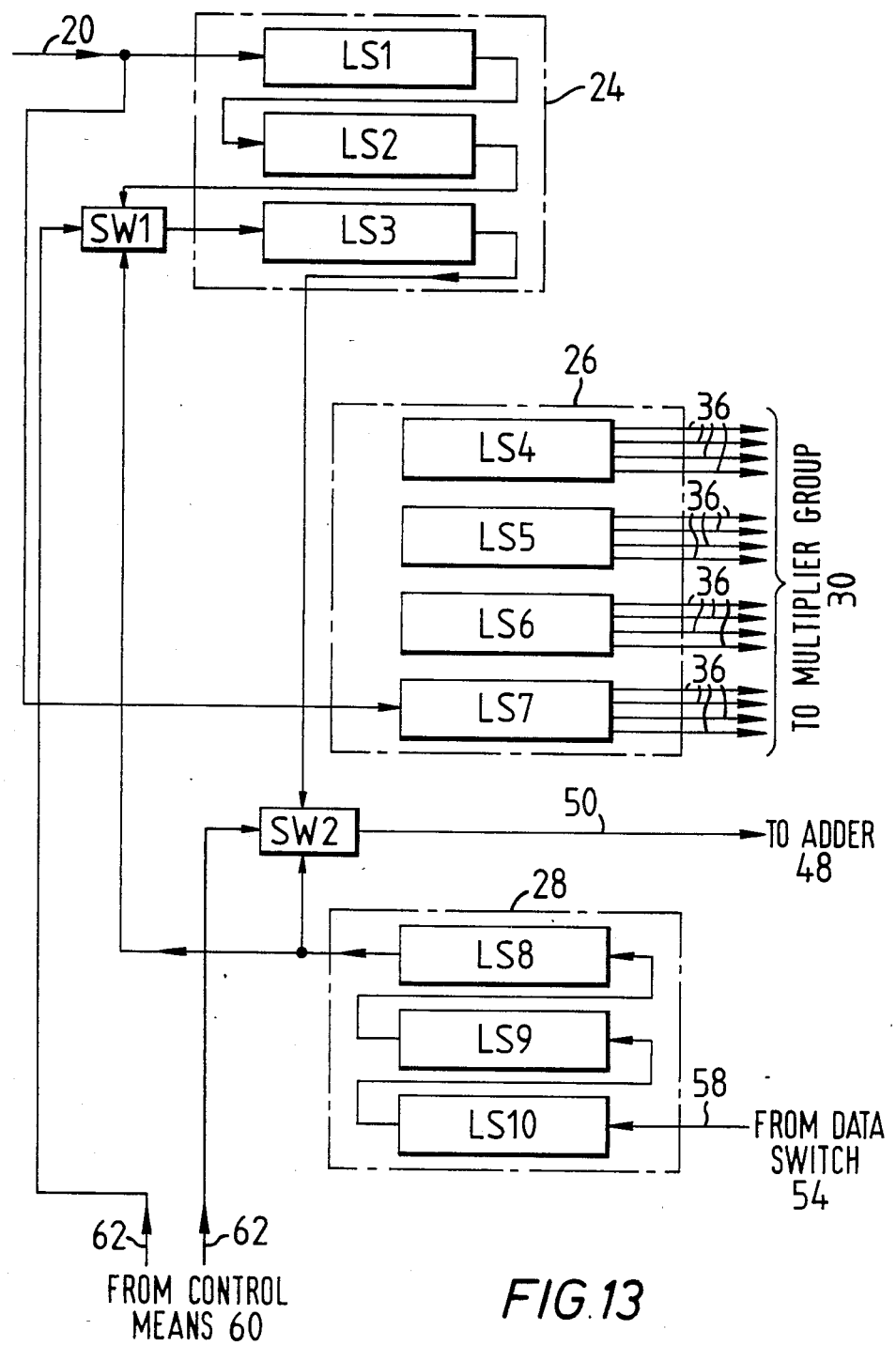
FIG. 13 is a more detailed showing of a memory of the 2D-FIR filter arrangement of FIG. 6.

As indicated above, the memory 22 need comprise a maximum of ten line stores. These are shown in FIG. 13 at LS1 to LS10. Each line store effectively operates as a shift register and has a number of stages equal to the number of samples per line (e.g. 864) in the input signal, each stage being able to handle a number of bits equal to the number of bits (e.g. 8) per sample of the input signal.

The prestore 24 is shown as being constituted by the line stores L1 to L3. The input image signal line 20 is connected to an input of the line store LS1. An output of the line store LS1 is connected to an input of the line store LS2 and an output of the line store LS2 is connectable to an input of the line store LS3 via a switch SW1. Accordingly, with the switch SW1 positioned to connect the line stores LS1 to LS3 in tandem, the input samples are clocked through them so that, during three lines of the input signal, these three lines become stored in the line stores LS1 to LS3.

The array store 26 is constituted by the line stores LS4 to LS7. Of these, the three stores LS4 to LS6 are memory mapped to the line stores LS1 to LS3 of the prestore 22 so that the contents of the stores LS1 to LS3 can be memory mapped into the stores LS4 to LS6 when required. The line store LS7 of the array store 26 is connected directly to the input image signal line 20 because, as explained above in the description of modes 5 and 8, only a maximum of three lines need to be prestored so that the fourth line can be fed directly into the array store.

The partial products store 28 is constituted by the three stores LS8 to LS10 which are connected in tandem as shown so that sub-totals (lines of intermediate products) arriving on the line 58 from the data switch 54 are shifted therethrough. An output from the final line store LS8 of the partial products store 28 is connectable to the line 50 leading to the adder 48 via a switch SW2. The output of the line store LS8 is connectable also, via the switch SW1, to the input of the line store LS3 of the prestore LS3, and an output of the line store LS3 is connectable to the line 50 via the switch SW2. The switches SW1 and SW2 are actuated by the control means 60 via the line 62.

The reason why the switches SW1 and SW2 are provided can be perceived from the foregoing description of mode 8. As indicated therein, in some lines (e.g. line 19) three lines of storage are required in the prestore 24 and three lines are required in the partial products store 28, while in other lines (e.g. line 18) two lines of storage are required in the prestore 24 and four lines are required in the partial products store 28. That is, while a maximum of three lines is needed in the prestore 22 and a maximum of four lines is needed in the partial products store 28, during any particular line the total storage requirement for these two stores is six rather than seven. It would of course be possible to provide the prestore 24 and partial products store 28 with three line stores and four line stores, respectively. However, that would mean using a total of eleven line stores in the memory 22. To save the cost of storage by reducing the total number of stores to ten, the line store LS3 is switched by the control means 60 between the prestore 24 and the partial products store 28 as required. Thus, in a first position of the switches SW1 and SW2 the line store LS3 forms part of the prestore 24, as shown in FIG. 13, whereas in a second position it forms part of the partial products store 28. In the first position, the output of the line store LS2 is connected to the input of the line store LS3 via the switch SW1 and the line store LS8 is connected to the line 50 via the switch SW2. In the second position the line store LS3 is connected in tandem with the line stores LS8 to LS10 via the switch and the output of the line store LS3 is connected to the line 50 via the switch SW2.

In the light of the foregoing explanation, it will be evident how the form of implementation of the memory 22 depicted in FIG. 13 functions in the case of modes 8 and 9. It will further be evident how the memory 22 of FIG. 13 can operate in the case of modes 5 and 7 by the provision of further switches (not shown) actuable by the control means 60 to switch out the components not necessary in these modes.

As will be appreciated from the foregoing description, the greater is the extent or degree of compression that is performed, the better is the performance of the above-described filter arrangement and the higher is its efficiency, this being due to the effective increase in the number of taps as the extent of the compression is increased. A basic figure of merit for the filter arrangement depends upon the amount of rejection of alias components in the zero/low compression mode (mode 1 above) with the highest compression permissible in that mode, i.e. just before it switches to a mode in which there is more than 2:1 compression in the vertical and/or horizontal direction, since under this condition the filter arrangement is in its most primitive form. The figure of merit depends in turn on the basic array size in the sense that the figure of merit increases with an increase (in either or both directions) of the basic array size. In the specific example given above, the basic array size was 4×4 (m=n=4). However, it is within the scope of the invention to use any basic array size from 2×2 upwards, and n and m (the array sizes in the horizontal and vertical directions, respectively) need not be equal to one another.

Figure 1:
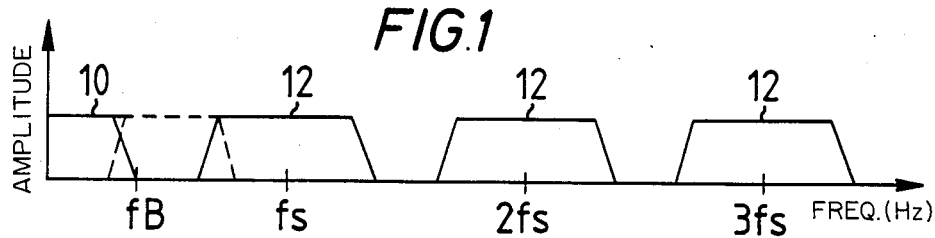
FIG. 1 shows the frequency response of a sampled image signal in the frequency domain, that is it is a graph of amplitude v. frequency (Hz), and shows how image compression can cause aliasing.
Figure 2A:
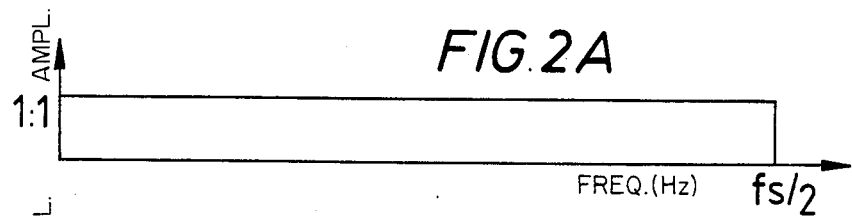
FIGS. 2A to 2D show amplitude/frequency characteristics of an ideal filter, to be used before image compression means to reduce the bandwidth of the signal to prevent aliasing, in the case of compression factors of 1:1, 2:1, 3:1 and 100:1, respectively.
Figure 2B:
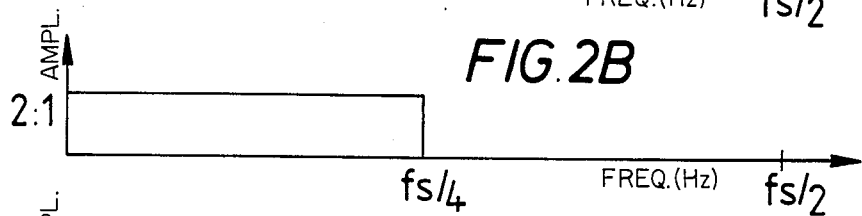
Figure 2C:
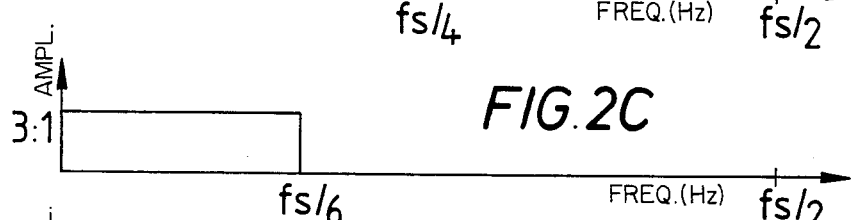
Figure 2D:
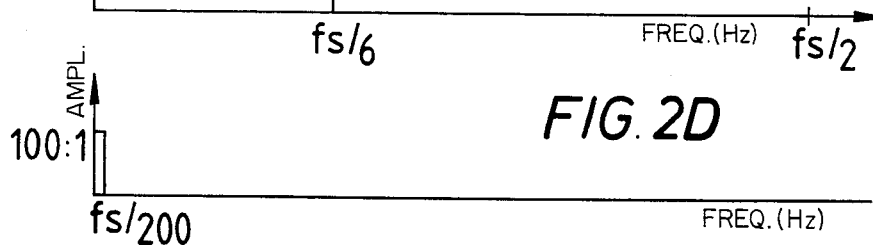
Figure 3:
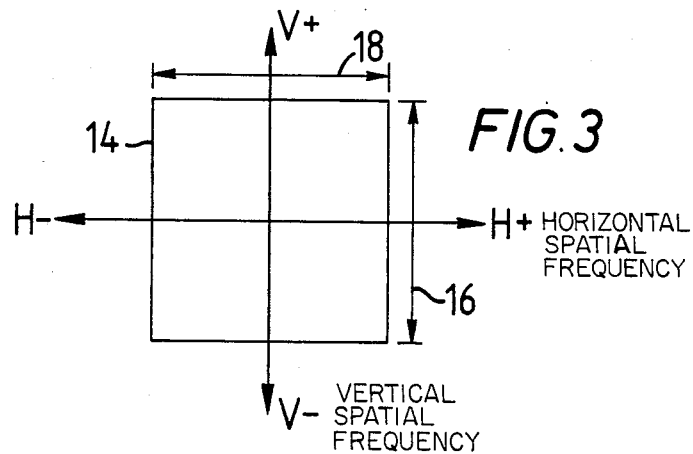
FIG. 3 shows the two-dimensional bandwidth of a 2D-FIR filter in the spatial domain.

The 2D-FIR filter arrangement may be designed (by appropriately calculating the values of the weighting coefficients of each set thereof) so as to be of the so-called variable separable form known to those skilled in the art, according to which the weighting coefficients of each set comprise two groups applicable to the horizontal and vertical directions (and therefore the bandwidths in the respective directions) respectively and are calculated substantially independently of one another. In this case, the two-dimensional bandwidth or response of the filter arrangement will be rectangular, as shown in FIG. 3. Instead of this, however, the filter arrangement may be designed to be of the so-called array form known to those skilled in the art, according to which all of the weighting coefficients of each set affect both the vertical and horizontal bandwidths. In this case, in which calculation of the weighting coefficients is more complex than in the variable separable case, the two-dimensional bandwidth or response of the filter arrangement will be circular.

As indicated above, the 2D-FIR filter described with reference to FIGS. 5 to 13 can be used with a compression means which is in the form of a digital video effects (DVE) unit. As also is indicated above, a DVE unit may require that the horizontal and/or vertical compression factor be changed over one image (for example a field of a television signal) in that it may be desired to achieve a video effect that calls for variation of the compression factors over different parts of the manipulated version of the image signal generated by the DVE unit. Therefore, in such cases, it is desired to carry out what can be termed dynamic control of the characteristics of the filter arrangement.

It is not of course possible to introduce a compression factor that requires access to samples no longer available in the prestore 24 of the array store 26. This leads to the following two consequences.

(i) The filter arrangement introduces a variable time delay which is dependent upon the basic array size thereof. That is, a 4×4 filter with a vertical compression of 4:1 will produce a delay of 12 lines because of the time used to calculate the partial products (subtotals). A direct form of this filter arrangement (that is a conventional 4×16 filter) would produce an output co-timed with the eighth line. In terms of output words or samples, an input sample appearing in the upper 4×4 array of a 4×16 array used in the case of 4:1 vertical compression might reasonably be expected to reappear 1½ lines later, that is half way between the first and fourth lines. The situation gets worse for larger compression factors. For example, in the case of 16:1 compression there will be a delay of 60 lines through the filter, though samples might be expected to reappear after 7½ lines.

(ii) In terms of arranging the timing of the calculation of partial products, it is not practical to alternate between odd and even compression factors in the vertical or the horizontal dimension without first going through a compression factor of 1:1 (mode 1) first and thus clearing all previous partial products.

Figure 14:
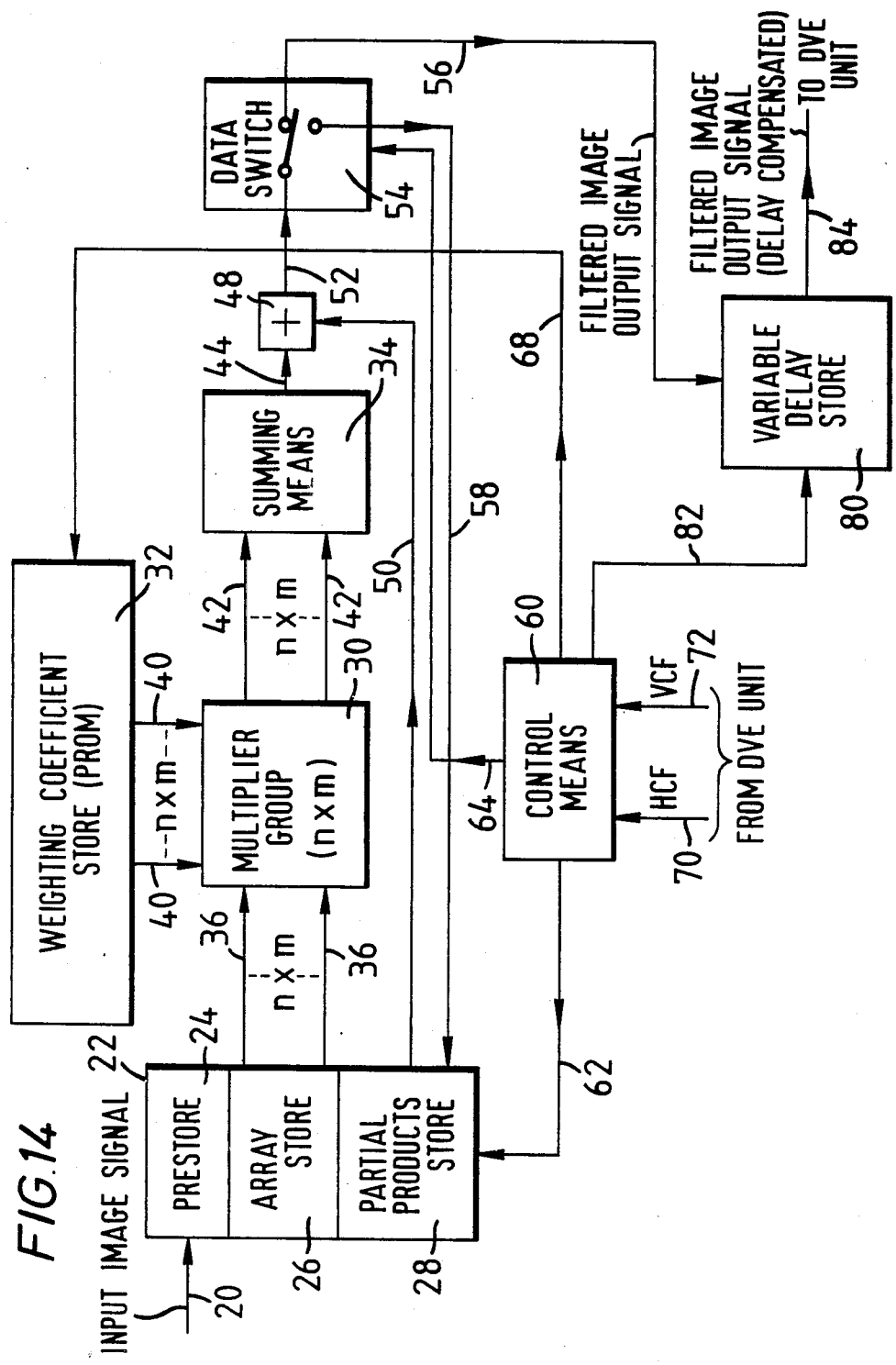
FIGS. 14 and 15 show further 2D-FIR filter arrangements embodying the invention, each of which comprises the arrangement as shown in FIG. 6 with respective enhancements to facilitate dynamic control of the filter arrangement.
Figure 15:
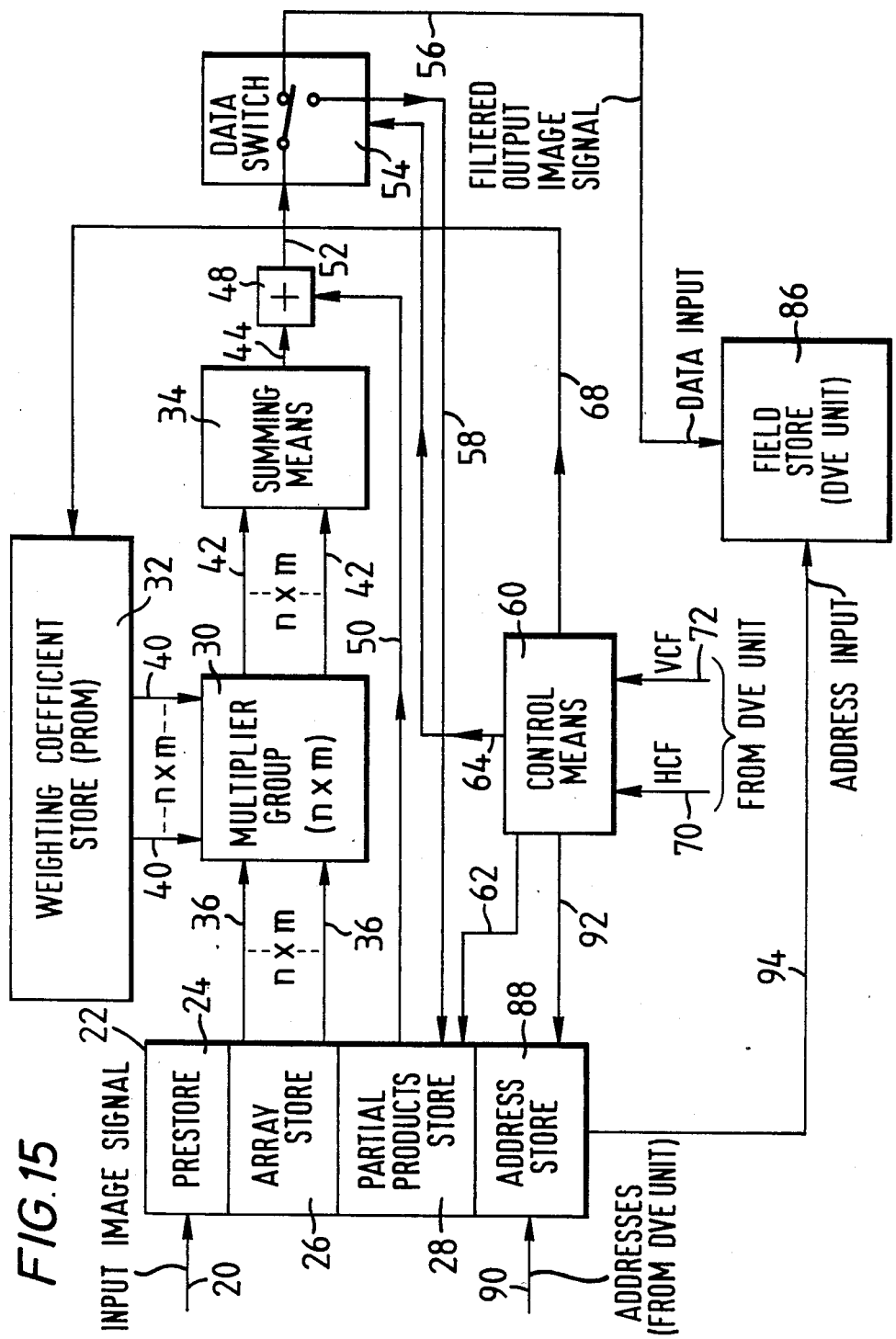

FIGS. 14 and 15 show respective enhancements to the 2D-FIR filter as shown in FIG. 6 which enable compensation for the variable delay mentioned in (i) above.

The 2D-FIR filter shown in FIG. 14 corresponds to that shown in FIG. 6, except that the output line 56 is connected to a variable delay store 80, which is under the control of the control means 60 via a line 82, and the output signal of the filter arrangement is developed on an output line 84 from the variable delay store 80. The variable delay store delays the output signal on the line 56 by an amount depending upon the mode of operation of the filter arrangement (and therefore the propagation delay therethrough), such that, regardless of the mode selected, there will always be a predetermined delay between the input signal on the line 20 and the output signal on the line 84.

The 2D-FIR filter arrangement shown in FIG. 15 corresponds to that shown in FIG. 6, with the following modifications. The output line 56 is connected to an input of a field store 86, which may be a field store of a DVE unit which is fed with the input image signal after it has been filtered. The memory 22 includes an address store 88 which is supplied with input addresses on a line 90. The address store 88 is controlled by the control means 60 via a line 92. Addresses are supplied from the address store 88 to the field store 86 via a line 94.

In the arrangement of FIG. 15, field store address information generated by the DVE unit is passed by the DVE unit into the address store 88 via the line 90. The control means 60 is operative to identify the central point of each filter array (once per output sample) and to store the coincident address which is then outputted via the line 94 to the field store 86 as the corresponding output sample is supplied to the field store 86 via the line 56. The address may be considered as an inactive partial product and the maximum storage required is in fact 4 lines. It should be noted that the delay through the filter rapidly becomes significant in terms of the field period as the effective array size of the filter arrangement gets larger. However, the largest array would need only to access the whole field of data and it could achieve this in a period far less than one field period, whereby no further delay compensation would be required.

The operation of a filter arrangement generally as described above could be extended so that it would act simultaneously as an interpolater to compensate for non-integer addresses, as described in co-pending European patent application publication No. EP-A-0 194 066 and in co-pending UK patent application Publication No. GB-A-2 172 167, each applied for by the assignees hereof, though a penalty would be paid in terms of the number of coefficients that would have to be stored to achieve this.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A two-dimensional finite impulse response (FIR) filter arrangement for filtering an image signal formed of a sequence of digital words mutually spaced apart in time by an interval T, the filter arrangement comprising:

a two-dimensional FIR filter operative during each of a plurality of successive clock periods equal to T to effect filtration over a predetermined area of said image by processing a set of said digital words of the image signal having a predetermined spatial relationship to produce therefrom an intermediate word;

storage means for storing at least some intermediate words produced during said successive clock periods; and control means responsive to a signal indicating an extent to which said image is to be compressed for controlling:

said FIR filter to adopt a bandwidth which is reduced, with respect to a value of the bandwidth for zero compression, by an extent related to said extent of compression, and for combining a plurality of said intermediate words, the size of which plurality is related to said extent of compression, so as to produce output words representative of filtration over a larger area of said image which is a multiple of said predetermined area.

2. A filter arrangement according to claim 1, wherein said FIR filter is operative during each said clock period to process a set of words of said image signal which form a two-dimensional array, and said control means is operative for combining a plurality of said intermediate words produced from adjacent ones of said words in said array.

3. A filter arrangement according to claim 2, wherein said FIR filter comprises a plurality of multipliers and a coefficient store containing a plurality of different sets of weighting coefficients for a respective plurality of different filter bandwidths, and wherein said control means is operative to select, for application to said multipliers, a set of weighting coefficients for controlling said filter to have a bandwidth related to said extent of compression.

4. A filter arrangement according to claim 2, wherein said FIR filter is operative to process a different set of words of said image signal during each successive clock period.

5. A filter arrangement according to claim 2, wherein said FIR filter is operative to process the same set of said digital words of said image signal during at least two successive clock periods, and said control means controls said FIR filter for filtering in a different manner during each of said at least two successive clock periods so as to form, from the same set of said digital words of said image signals, a plurality of different intermediate words for combination with other intermediate words to form respective different output words.

6. A filter arrangement according to claim 2, wherein, in at least one operating mode determined by said extent of compression, said FIR filter is operative to process a different set of said digital words of said image signal during each successive clock period, and wherein, in at least one other operating mode determined by said extent of compression, said FIR filter is operative to process the same set of said digital words of said image signal during at least two successive clock periods, and said control means controls said FIR filter for filtering in a different manner during each of said at least two successive clock periods so as to form, from the same set of said digital words of said image signal, a plurality of different intermediate words for combination with other intermediate words to form respective different output words.

7. A filter arrangement according to claim 2, wherein said control means combines a plurality of intermediate words that are produced during a part of said image signal comprising a line of an image of said image signal.

8. A filter arrangement according to claim 2, wherein said control means combines a plurality of intermediate words that are produced during respective parts of said image signal comprising respective different lines of an image of said image signal.

9. A filter arrangement according to claim 2, wherein said control means combines a plurality of intermediate words that are produced both during a part of said image signal comprising a line of an image of said image signal and during respective parts of said image signal comprising respective different lines of said image.

10. A filter arrangement according to claim 2, further comprising a variable delay store connected to receive said output words, said control means controlling said variable delay store to delay said output words by an extent related to said extent of compression in such a manner that, regardless of said extent of compression, said output words when so delayed are delayed by a predetermined amount with respect to said input signal.

11. A filter arrangement according to claim 2, further comprising a field store connected to receive said output words and an address store for receiving field store address information, said control means identifying a central point of said larger image area for each output word and supplying a stored address of said central point to said field store together with the output word.

12. A filter arrangement according to claim 1, wherein said FIR filter comprises a plurality of multipliers and a coefficient store containing a plurality of different sets of weighting coefficients for a respective plurality of different filter bandwidths, and wherein said control means is operative to select, for application to said multipliers, a set of weighting coefficients for controlling said filter to have a bandwidth related to said extent of compression.

13. A filter arrangement according to claim 1, wherein said FIR filter is operative to process a different set of words of said image signal during each successive clock period.

14. A filter arrangement according to claim 1, wherein said FIR filter is operative to process the same set of said digital words of said image signal during at least two successive clock periods, and said control means controls said FIR filter for filtering in a different manner during each of said at least two successive clock periods so as to form, from the same set of said digital words of said image signal, a plurality of different intermediate words for combination with other intermediate words to form respective different output words.

15. A filter arrangement according to claim 1, wherein, in at least one operating mode determined by said extent of compression, said FIR filter is operative to process a different set of said digital words of said image signal during each successive clock period, and wherein, in at least one other operating mode determined by said extent of compression, said FIR filter is operative to process the same set of said digital words of said image signal during at least two successive clock periods, and said control means controls said FIR filter for filtering in a different manner during each of said at least two successive clock periods so as to form, from the same set of said digital words of said image signal, a plurality of different intermediate words for combination with other intermediate words to form respective different output words.

16. A filter arrangement according to claim 1, wherein said control means combines a plurality of intermediate words that are produced during a part of said image signal comprising a line of an image of said image signal.

17. A filter arrangement according to claim 1, wherein said control means combines a plurality of intermediate words that are produced during respective parts of said image signal comprising respective different lines of an image of said image signal.

18. A filter arrangement according to claim 1, wherein said control means combines a plurality of intermediate words that are produced both during a part of said image signal comprising a line of an image of said image signal and during respective parts of said image signal comprising respective different lines of said image.

19. A filter arrangement according to claim 1, further comprising a variable delay store connected to receive said output words, said control means controlling said variable delay store to delay said output words by an extent related to said extent of compression in such a manner that, regardless of said extent of compression said output words when so delayed are delayed by a predetermined amount with respect to said input signal.

20. A filter arrangement according to claim 1, further comprising a field store connected to receive said output words and an address store for receiving field store address information, said control means identifying a central point of said larger image area for each output word and supplying a stored address of said central point to said field store together with the output word.

* * * * *